United States Patent
Varga et al.

(10) Patent No.: US 11,906,362 B2
(45) Date of Patent: Feb. 20, 2024

(54) SYSTEMS AND METHODS FOR THERMAL RADIATION DETECTION

(71) Applicant: The Procter & Gamble Company, Cincinnati, OH (US)

(72) Inventors: Stephen Michael Varga, Loveland, OH (US); Steven Henry Mersch, Germantown, OH (US)

(73) Assignee: The Procter & Gamble Company, Cincinnati, OH (US)

(*) Notice: Subject to any disclaimer, the term of this patent is extended or adjusted under 35 U.S.C. 154(b) by 0 days.

(21) Appl. No.: 18/156,423

(22) Filed: Jan. 19, 2023

(65) Prior Publication Data

US 2023/0152158 A1 May 18, 2023

Related U.S. Application Data

(63) Continuation of application No. 17/206,177, filed on Mar. 19, 2021, now Pat. No. 11,592,336, which is a
(Continued)

(51) Int. Cl.
*G01J 5/03* (2022.01)
*H01L 27/146* (2006.01)
(Continued)

(52) U.S. Cl.
CPC . *G01J 5/03* (2022.01); *G01J 5/24* (2013.01); *H01L 27/14649* (2013.01); *H01L 31/02966* (2013.01); *H04N 5/33* (2013.01)

(58) Field of Classification Search
CPC ...... G01J 5/03; G01J 5/24; G01J 5/064; G01J 3/0227; G01J 2005/0077; G01J 5/061;
(Continued)

(56) References Cited

U.S. PATENT DOCUMENTS

| 5,201,582 A | 4/1993 | Lesniak |
| 6,396,191 B1 | 5/2002 | Hagelstein et al. |

(Continued)

FOREIGN PATENT DOCUMENTS

| EP | 3413023 A2 | 12/2018 |
| JP | 2011095143 A | 5/2011 |

(Continued)

OTHER PUBLICATIONS

All Office Actions; U.S. Appl. No. 17/029,103, filed Sep. 23, 2020.
(Continued)

*Primary Examiner* — David P Porta
*Assistant Examiner* — Meenakshi S Sahu
(74) *Attorney, Agent, or Firm* — Christian M. Best; Charles R. Matson (57) ABSTRACT

Systems and methods for thermal radiation detection utilizing a thermal radiation detection system are provided. The thermal radiation detection system includes one or more mercury-cadmium-telluride (HgCdTe)-based photodiode infrared detectors or Indium Arsenide (InAs)-based photodiode infrared detectors and a temperature sensing circuit. The temperature sensing circuit is configured to generate signals correlated to the temperatures of one or more of the plurality of infrared sensor elements. The thermal radiation detection system also includes a signal processing circuit.

22 Claims, 9 Drawing Sheets

Related U.S. Application Data continuation-in-part of application No. 17/029,103, filed on Sep. 23, 2020, now Pat. No. 11,585,697.

(60) Provisional application No. 62/906,782, filed on Sep. 27, 2019.

(51) Int. Cl.
*G01J 5/24* (2006.01)
*H01L 31/0296* (2006.01)
*H04N 5/33* (2023.01)

(58) Field of Classification Search
CPC ......... H01L 27/14649; H01L 27/14609; H01L 27/14696; H01L 31/035281; H01L 31/1032; H01L 31/024; H01L 31/1035; H04N 5/33; H04N 5/357; G01N 21/3563; G01N 21/8903
See application file for complete search history.

(56) References Cited

U.S. PATENT DOCUMENTS

| | | |
|---|---|---|
| 11,585,697 B2 | 2/2023 | Varga et al. |
| 11,592,336 B2 | 2/2023 | Varga et al. |
| 2005/0029453 A1 | 2/2005 | Allen et al. |
| 2007/0090337 A1 | 4/2007 | Ueno et al. |
| 2008/0019881 A1 | 1/2008 | Fujimoto |
| 2009/0134333 A1* | 5/2009 | Ishibashi .................. H03F 3/08 250/352 |
| 2012/0287418 A1 | 11/2012 | Scherer et al. |
| 2015/0028216 A1 | 1/2015 | Camargo |
| 2015/0356351 A1 | 12/2015 | Saylor et al. |
| 2021/0096029 A1 | 4/2021 | Varga et al. |
| 2021/0223109 A1 | 7/2021 | Varga et al. |

FOREIGN PATENT DOCUMENTS

| | | |
|---|---|---|
| JP | 2012078159 A | 4/2012 |
| JP | 5564681 B2 | 6/2014 |
| WO | 2019102684 A1 | 5/2019 |

OTHER PUBLICATIONS

All Office Actions; U.S. Appl. No. 17/206,177, filed Mar. 19, 2021.
All Office Actions; U.S. Appl. No. 18/157,099, filed Jan. 20, 2023.
Gottfert_Fabian_ "Optimizing microscan for radiometry with cooled IR cameras" vol. 11001, pp. 8, dated May 14, 2019.
Unpublished U.S. Appl. No. 18/157,099, filed Jan. 20, 2023, to Stephen Michael Varga et al.

* cited by examiner

SYSTEMS AND METHODS FOR THERMAL RADIATION DETECTION

CROSS-REFERENCE TO RELATED APPLICATIONS

This application is a continuation of, and claims priority under 35 U.S.C. § 120 to, U.S. patent application Ser. No. 17/206,177, filed on Mar. 19, 2021, which is a continuation-in-part of, and claims priority under 35 U.S.C. § 120 to, U.S. patent application Ser. No. 17/029,103, filed on Sep. 23, 2020, which claims the benefit, under 35 U.S.C. § 119(e), to U.S. Provisional Patent Application No. 62/906,782, filed on Sep. 27, 2019, the entire disclosures of each of which are herein incorporated by reference in their entirety.

FIELD OF THE INVENTION

The present disclosure relates to systems and methods for inspecting manufacturing processes, and more particularly, systems and methods for inspecting manufacturing processes using high-speed thermal radiation detection.

BACKGROUND OF THE INVENTION

Along an assembly line, absorbent articles may be assembled by adding components to and otherwise modifying an advancing, continuous web of material. For example, in some processes, advancing webs of material are combined with other advancing webs of material. In other examples, individual components created from advancing webs of material are combined with advancing webs of material, which in turn, are then combined with other advancing webs of material. Webs of material and component parts used to manufacture absorbent articles, such as diapers, may include: backsheets, topsheets, absorbent cores, front and/or back ears, fastener components, and various types of elastic webs and components such as leg elastics, barrier leg cuff elastics, and waist elastics. Once the desired component parts are assembled, the advancing web(s) and component parts are subjected to a final knife cut to separate the web(s) into discrete diapers or other absorbent articles. The discrete diapers or other absorbent articles may also then be folded and packaged.

For quality control purposes, absorbent article converting lines, packaging lines, or industrial automation machinery or processes may utilize various types of sensor technology to inspect the webs and discrete components added, transformed, or manipulated within the process. Example sensor technology may include vision systems, photoelectric sensors, proximity sensors, laser or sonic distance detectors, and the like. Product inspection data from the sensors may be communicated to a controller in various ways. In turn, the controller may be programmed to receive product inspection data, and in turn, make adjustments to the manufacturing process. In some instances, the controller may reject defective absorbent articles based on the product inspection data after the final knife cut at the end of the converting line.

In addition, manufacturing processes may utilize various types of sensor technology to monitor the performance of various types of assembly equipment used in the industrial process. Example process sensor technology may include speed sensors, linear or radial position sensors, temperature, pressure or vacuum sensors, vision systems, proximity sensors, and the like. Process data from the process sensors may be communicated to a controller in various ways. In turn, the controller may be programmed to receive process data, and in turn, make adjustments to the manufacturing process and/or communicate potential problems associated with assembly equipment to technicians or operators. In some instances, based on the process data, the controller may automatically shutdown the process.

Some absorbent article converting lines, assembly processes, industrial processes, or equipment may utilize infrared sensors to monitor performance, or otherwise provide operational feedback regarding the webs, discrete components, or other equipment or processes. There are thermal type infrared sensors (e.g., pyroelectric elements or thermopiles) that employ temperature changes generated by the absorption of infrared energy, and quantum type infrared sensors that employ changes in conductivity, or in electromotive force, voltage, or current, that are generated by electrons excited by incident photons. The thermal type, however, which can be operated at room temperature, has disadvantages in that it requires broad-band wavelength exposure (typically more than 4 microns) and a low sensitivity and in that its response speed is slow. Due to the low sensitivity and slow response speed, these type of sensors are not typically adequate for use in monitoring higher speed manufacturing processes. On the other hand, the quantum type, although it must be cooled to extremely low temperatures, has characteristics such as requiring less broad-band wavelength exposure (typically less than 4 microns) and high sensitivity and high response speed. Many quantum type sensors must be cooled using liquid nitrogen or liquid helium or by using electronic cooling, such as using a Stirling cooler for example, in order to provide reduce nose and achieve the desired sensitivity. In some instances, these types of sensors must be cooled to about −200° Celsius. Cooling the entire sensor requires the overall form factor to be increased, and accordingly, makes it challenging, if not impractical, to incorporate such sensors into small spaces. In many cases, positioning such sensors proximate to a manufacturing system to verify a manufacturing process via an infrared signal is not feasible due to the confines of the surrounding machinery, in addition to other limitations. The cooling requirements require more energy in addition to space. The cooling components consume additional power, and in turn, generate additional thermal noise which must be directed, contained, or transported away. Therefore, there is a need for systems and methods for providing infrared sensing for manufacturing systems with the sensing have the desired response speed and form factor.

For some non-industrial applications, such as vehicle, pedestrian, or object collision avoidance, detection, tracking, or monitoring; some applications require sensors which are both fast and able to operate at ambient temperature. The cooling requirements for such applications prohibits practicality for many of the same reasons as industrial applications, namely cost, speed, size, and power consumption.

SUMMARY OF THE INVENTION

In one form, a thermal radiation detection system comprises a plurality of infrared sensor elements arranged as an array, wherein each of the plurality of infrared sensor elements comprises a semiconductor selected from a mercury-cadmium-telluride (HgCdTe)-based photodiode infrared detector, or an Indium Arsenide (InAs)-based photodiode infrared detector, configured to generate an output responsive to detected mid-infrared wavelengths. The thermal radiation detection system may also comprises an amplifier circuit, the amplifier circuit being configured to convert the current outputs from the plurality of infrared sensor elements to output voltages. The thermal radiation detection system also comprises a temperature sensing circuit, the temperature sensing circuit being configured to generate signals correlated to temperatures of one or more of the plurality of infrared sensor elements. The thermal radiation detection system also comprises a signal processing circuit, the signal processing circuit configured to generate a signal usable by an imaging system based on the signals generated by the temperature sensing circuit and the output voltages from the amplifier circuit or infrared sensor elements. The signals generated by the temperature sensing circuit is used to correct for noise or drift from the signals generated by the infrared sensor elements or their associated amplifier. The correction can be a linear or non-linear correction, depending on the characterization of signals. In some embodiments, the corrections are look up tables corresponding to known experimental or historical conditions.

The electrodes connected to the infrared sensor elements are arranged such that the connections are not on the same surface as the incident infrared energy allowing a larger proportion of the surface to receive energy unimpeded by connection terminals. The larger proportion of the exposed surface increases the efficiency and signal-to-noise rations and therefore improving the speed and sensitivity of the detection elements.

The improved signal-to-noise ratio of the infrared sensor elements allows the system to be operated at ambient temperature. Ambient temperature for some field conditions would be above 0° C. and below 55° C. Preferably ambient temperature is defined as between 5° C. and 25° C. The ambient temperature for some field conditions may be raised due to proximity to other items such as motors, heaters, CPUs, or generators. The ambient temperature for some field conditions may be lowered due to proximity to other items such forced or entrained fluid or air movement.

In another form, a thermal radiation detection system comprises a first mercury-cadmium-telluride (HgCdTe)-based or an Indium Arsenide (InAs)-based photodiode infrared detector configured to generate a first output responsive to detected infrared wavelengths and a first transimpedance amplifier to convert the current output from the first HgCdTe-based or InAs-based photodiode infrared detector to an output voltage. The thermal radiation detection system also comprises a first temperature sensing device positioned proximate to the first HgCdTe-based or InAs-based photodiode infrared detector, the first temperature sensing device to generate a signal correlated to temperature. The thermal radiation detection system also comprises a signal processing circuit, the signal processing circuit configured to generate a signal based on the signal generated by the first temperature sensing circuit and the output voltage from the first transimpedance amplifier.

In another form, a method for inspecting an article manufacturing process comprises positioning a thermal radiation detection system proximate to a manufacturing process, advancing an article past the plurality of infrared sensor elements subsequent to the manufacturing process, and identifying characteristics of the manufacturing process based on the signal from the signal processing circuit.

BRIEF DESCRIPTION OF THE DRAWINGS

The above-mentioned and other features and advantages of the present disclosure, and the manner of attaining them, will become more apparent, and the disclosure itself will be better understood, by reference to the following description of non-limiting embodiments of the disclosure taken in conjunction with the accompanying drawings, wherein.

DETAILED DESCRIPTION OF THE INVENTION

The present disclosure relates to high speed infrared sensor systems and methods thereof. Various nonlimiting embodiments of the present disclosure will now be described to provide an overall understanding of the principles of the function, design and operation of the systems and methods. One or more examples of these nonlimiting embodiments are illustrated in the accompanying drawings. Those of ordinary skill in the art will understand that the systems and methods described herein and illustrated in the accompanying drawings are nonlimiting example embodiments and that the scope of the various nonlimiting embodiments of the present disclosure are defined solely by the claims. The features illustrated or described in connection with one nonlimiting embodiment may be combined with the features of other nonlimiting embodiments. Such modifications and variations are intended to be included within the scope of the present disclosure.

Figure 1:
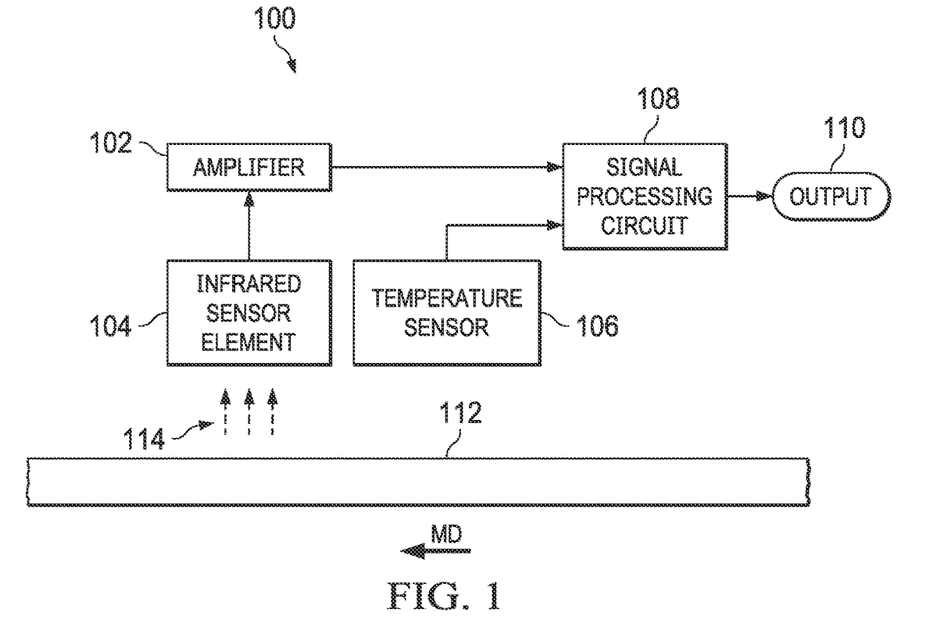
FIG. 1 schematically depicts a thermal radiation detection system in accordance with an example embodiment.

FIG. 1 schematically depicts a thermal radiation detection system 100 in accordance with an example embodiment. Various components of the thermal radiation detection system 100 can be positioned proximate to an article 112 in order to detect incident infrared radiation, schematically depicted as infrared radiation 114. The article 112 can comprise, for example, any of a web, a substrate, a bottle, a package, a component of machinery, an elastic, an adhesive, an absorbent gelling material (AGM), a printing, a chemical additive, a lotion, and a volatile composition. The infrared radiation 114 can be used to assess the quality or other characteristic of a manufacturing process, such as an application of an adhesive to the article 112, seaming of the article 112, heat bonding the article 112, pressure welding the article 112, cohesive bonding the article 112, and so forth.

The thermal radiation detection system 100 can include at least one infrared sensor element 104 that is positioned proximate to a temperature sensor 106. The temperature sensor 106 can be any suitable sensing device, such as a negative temperature coefficient thermistor, a thermocouple, a photodiode sensitive to infrared energy, or a resistance temperature detector, for example. Responsive to the detected infrared radiation 114, the infrared sensor element 104 can provide an output to an amplifier 102. The amplifier 102 can convert the current output from the infrared sensor element 104 to an output voltage. The amplifier 102 can be any suitable application, and in some embodiments, is implemented as a transimpedance amplifier (TIA).

A signal processing circuit 108 can receive the output voltage from the amplifier 102 along with a signal from the temperature sensor 106. The signal processing circuit 108 can, in turn, generate an output signal 110 that can be usable by an imaging system, or other suitable system. In some embodiments, the signal processing circuit 108 is an application-specific integrated circuit (ASIC), a field programmable gate array (FPGA), a central processing unit (CPU), or a graphics processing unit (GPU). In some embodiments, the signal processing circuit 108 is a virtualized ASIC, FPGA, CPU, or GPU on a network, internet cloud, or other virtualized computing platform.

The amplifier 102 may be integrated with the signal processing circuit 108 or may be after the signal processing circuit 108.

The infrared sensor element 104 can comprise photodiode infrared detector comprising a semiconductor, wherein the semiconductor is selected from mercury-cadmium-telluride also referred to as an MCT, or indium arsenide or combinations thereof. The infrared sensor element can comprise a mercury-cadmium-telluride (HgCdTe)-based photodiode infrared detector, or an Indium Arsenide (InAs)-based photodiode infrared detector, that is configured to generate an output responsive to detected infrared wavelengths. Such detected wavelengths of infrared radiation can be usable for inspection purposes, quality control, and so forth. In some embodiments, the detected infrared wavelengths are about 4 microns to about 14 microns, for example, specifically reciting all 0.5 micron increments within the above-recited range and all ranges formed therein or thereby. The temperature sensor 106 can be a component of a temperature sensing circuit of the thermal radiation detection system 100. As the output generated by the infrared sensor element 104 can be dependent on operational temperature, the temperature sensing circuit can be configured to generate a signal that correlates to the temperature of the infrared sensor element 104.

Figure 2:
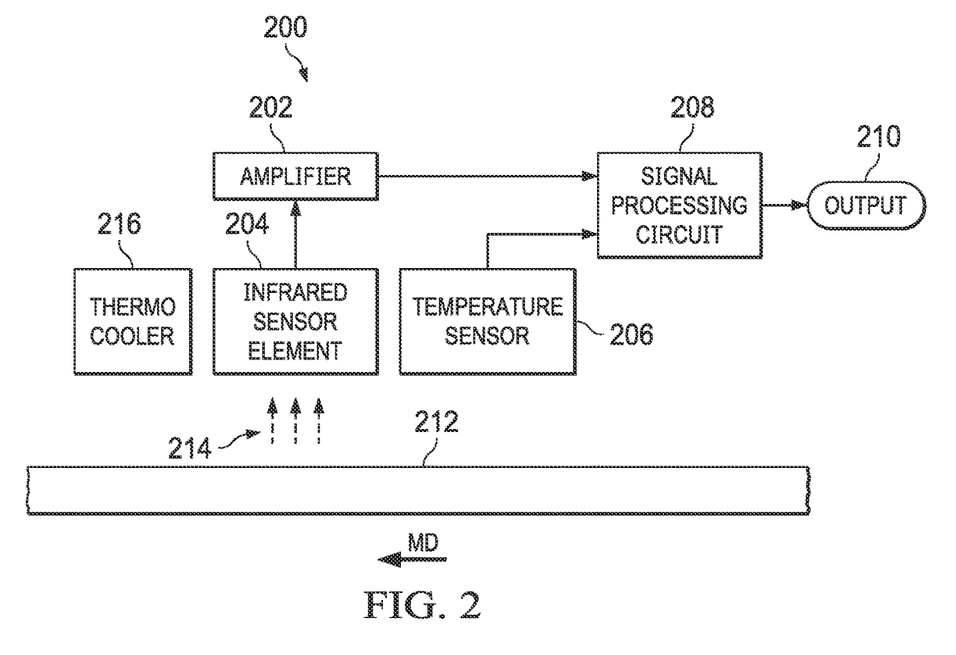
FIG. 2 schematically depicts another thermal radiation detection system in accordance with an example embodiment.

FIG. 2 schematically depicts another thermal radiation detection system 200 in accordance with an example embodiment. This thermal radiation detection system 200 is similar to the thermal radiation detection system 100, as it includes at least one infrared sensor element 204 that is positioned proximate to a temperature sensor 206. Responsive to detected infrared radiation 214 from an article 212, the infrared sensor element 204 can provide an output to an amplifier 202. The amplifier 202 can convert the current output from the infrared sensor element 204 to an output voltage. A signal processing circuit 208 can receive the output voltage from the amplifier 202 along with a signal from the temperature sensor 206. The signal processing circuit 208 can, in turn, generate an output signal 210 that can be usable by an imaging system, or other suitable system.

In this embodiment, however, the thermal radiation detection system 200 includes a cooling circuit that includes a thermoelectric cooler 216 that is positioned proximate to the infrared sensor element 204. The thermoelectric cooler 216 can be configured to generally regulate an operational temperature of the infrared sensor element 204. In accordance with various implementations, the thermoelectric cooler 216 is configured to regulate the operational temperature of the infrared sensor element 204 to within a range of about 5° C. to about 40° C., specifically reciting all 1° C. increments within the above-recited range and all ranges formed therein or thereby. In some implementations, the thermoelectric cooler 216 is configured to regulate the operational temperature of the infrared sensor element 204 to a range of about 15° C. to about 24° C., specifically reciting all 1° C. increments within the above-recited range and all ranges formed therein or thereby.

As the signals generated by the infrared sensor element 204 can be temperature dependent, including a cooling circuit in the thermal radiation detection system 200 can help to control and limit feedback runaway and to maintain certain operational conditions for the infrared sensor element 204. Other cooling mechanisms may be implemented to accomplish the same result such as fan cooling or heat sinks, for example.

Figure 3:
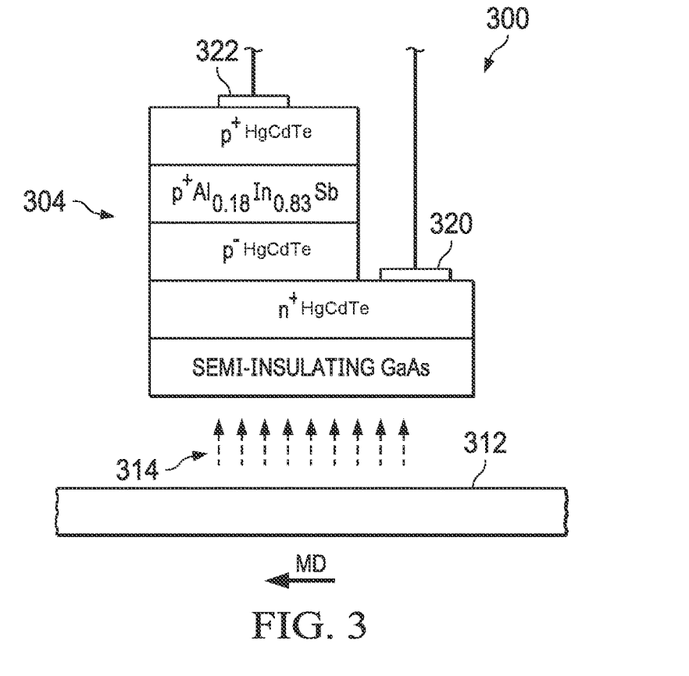
FIG. 3 provides a simplified view of an infrared sensor element in accordance with an example embodiment.

FIG. 3 provides a simplified view of an infrared sensor element 304 in accordance with an example embodiment. The infrared sensor element 304 can be a component of a thermal radiation detection system 300, for example. The infrared sensor element 304 can include a plurality of layers, including a semi-insulating Gallium arsenide (GaAs) substrate, in a plan view. A first electrode 320 can be electrically coupled to a first of the plurality of layers and a second electrode 322 can be electrically coupled to a second of the plurality of layers. The detected infrared wavelengths from an article 312, schematically shown as infrared radiation 314, are transmitted through the GaAs substrate to the first and second electrodes 320 and 322. Notably, the first and second electrodes 320 and 322 are not positioned on the same surface that is receiving the infrared radiation 314 from the article 312. This placement of the first and second electrodes 320 and 322 beneficially prevents them from interrupting or masking the infrared sensor, thereby creating a larger surface area for collecting the infrared radiation 314 and contributing to quick spectral response. Suitable alternatives to Gallium arsenide are Indium gallium arsenide (InGaAs, extended-InGaAs), or Germanium (Ge).

Figure 4:
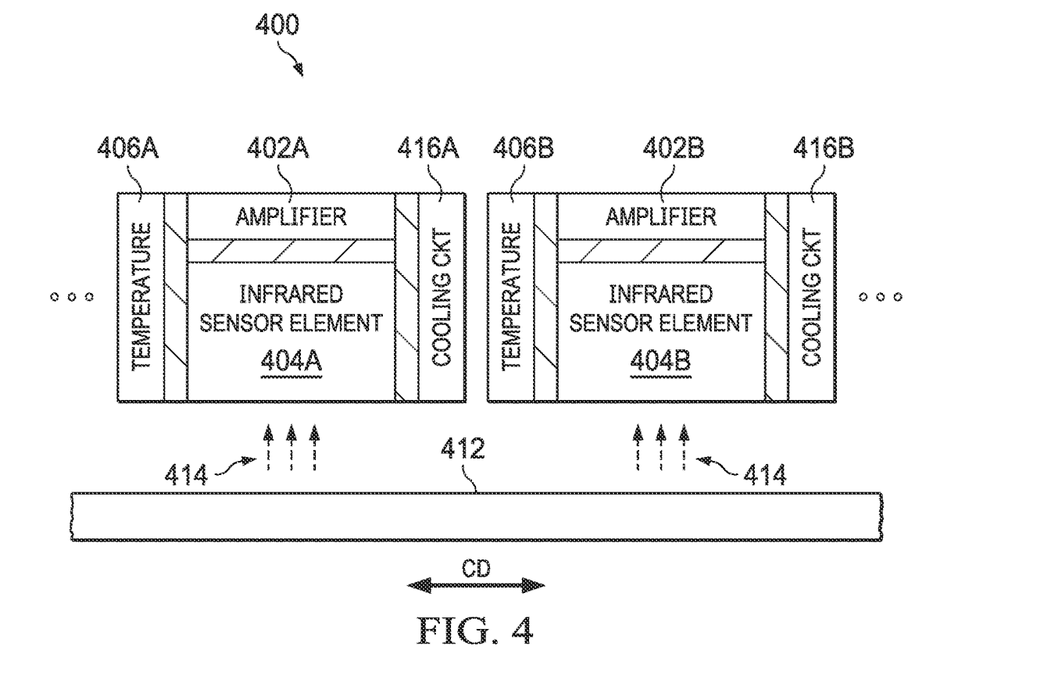
FIG. 4 depicts a portion of an example thermal radiation detection system.

While FIGS. 1 and 2 depict single infrared sensor elements 104 and 204 for the purposes of illustration, in some embodiments a thermal radiation detection system can include an array of infrared sensor elements. FIG. 4 depicts a portion of a thermal radiation detection system 400 that includes an array of infrared sensor elements. While two infrared sensor elements 404A and 404B are shown for the purposes of illustration in FIG. 4, it is to be appreciated that the array can include any suitable number of infrared sensor elements. In some configurations, the array is sized such that it extends in a cross direction (CD) relative to an article 412 to detect infrared radiation 414 across substantially the entire width of the article 412. The array could as well be implemented to extend across only a portion of an article 412 to acquire representative signals without the need to extend across the entire article. As shown in FIG. 4, various components of the thermal radiation detection system 400 can be bonded to other components, such as through thermally conductive adhesives. In this regard, the infrared sensor element 404A is shown bonded to a temperature sensor 406A, an amplifier 402A, and a cooling circuit 416A. Similarly, the infrared sensor element 404B is shown bonded to a temperature sensor 406B, an amplifier 402B, and a cooling circuit 416B. While FIG. 4 depicts a one-to-one arrangement with regard to infrared sensor elements and the temperature sensor and the cooling circuit, this disclosure is not so limited. In other embodiments, as shown FIGS. 5 and 6, for example, the temperature sensor and the cooling circuit may have a one-to-many arrangement with regard to infrared sensor elements.

Figure 5:
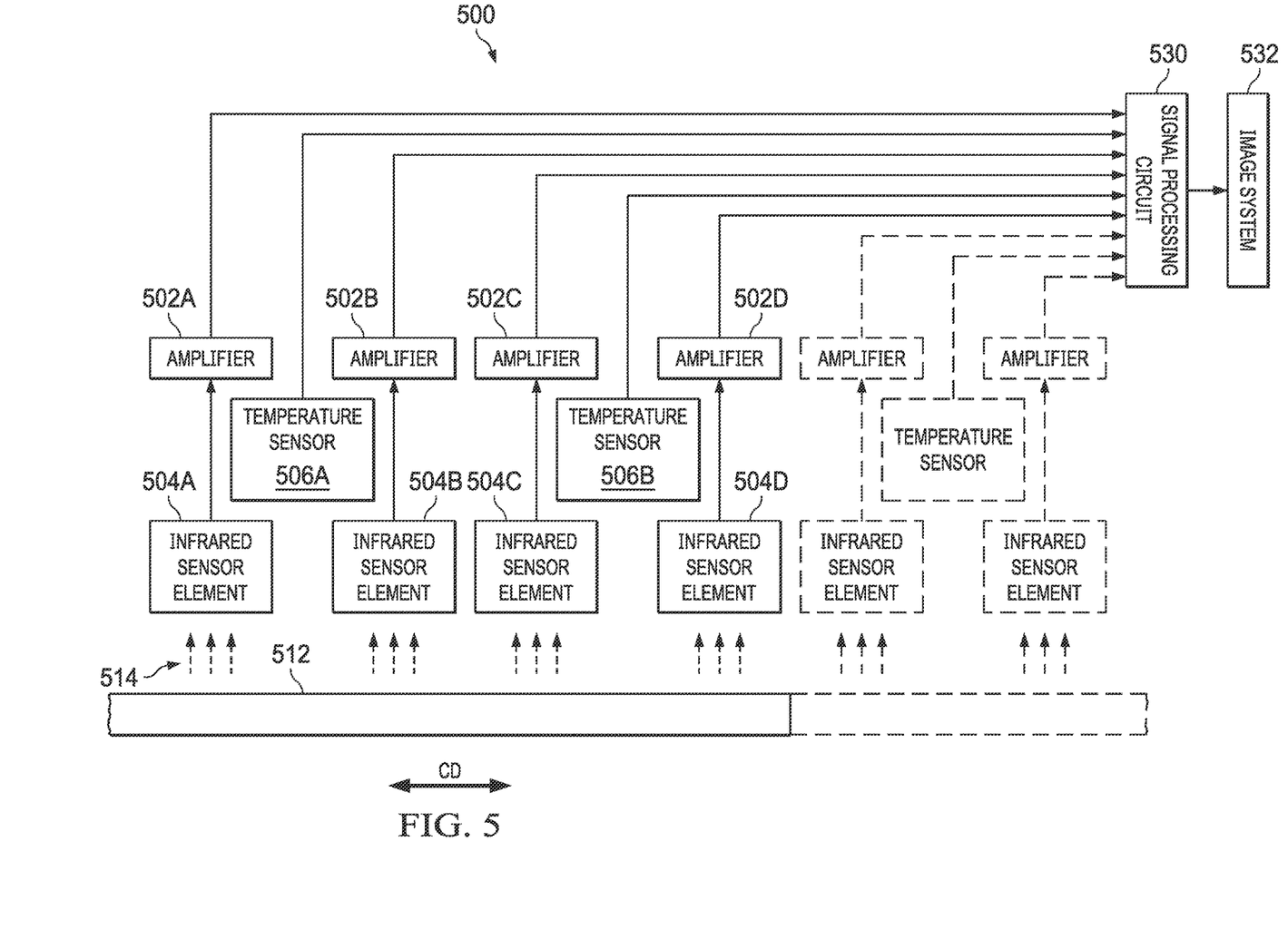
FIG. 5 schematically depicts a thermal radiation detection system having an array of infrared sensor elements.

FIG. 5 schematically depicts a thermal radiation detection system 500 having an array of infrared sensor elements 504A-D. While four infrared sensor elements 504A-D are shown for the purposes of illustration, the thermal radiation detection system 500 can include any suitable number of infrared sensor elements, as indicated by the infrared sensor elements shown in dashed lines. The array of infrared sensor elements 504A-D can be arranged such that it generally extends in a cross direction (CD) across an article 512 to detect infrared radiation 514. In this embodiment, each infrared sensor element 504A-D is configured to provide an output signal to a respective amplifier 502A-D. Each of the amplifiers 502A-D is configured to provide its output to a signal processing circuit 530. Additionally, temperature sensors 506A and 506B are configured to provide signals to the signal processing circuit 530 responsive to the sensed temperature proximate to one or more of the infrared sensor elements 504A-D. In the illustrated embodiment, the temperature sensor 506A provides temperature information for infrared sensor elements 504A and 504B, and the temperature sensor 506B provides temperature information for infrared sensor elements 504C and 504D. As is to be appreciated, however, other arrangements can be used without departing from the scope of the present disclosure. Responsive to the signals received from the amplifiers 502A-D and the temperature sensors 506A and 506B, the signal processing circuit 530 can provide an output to an image system 532, or other suitable system.

Figure 6:
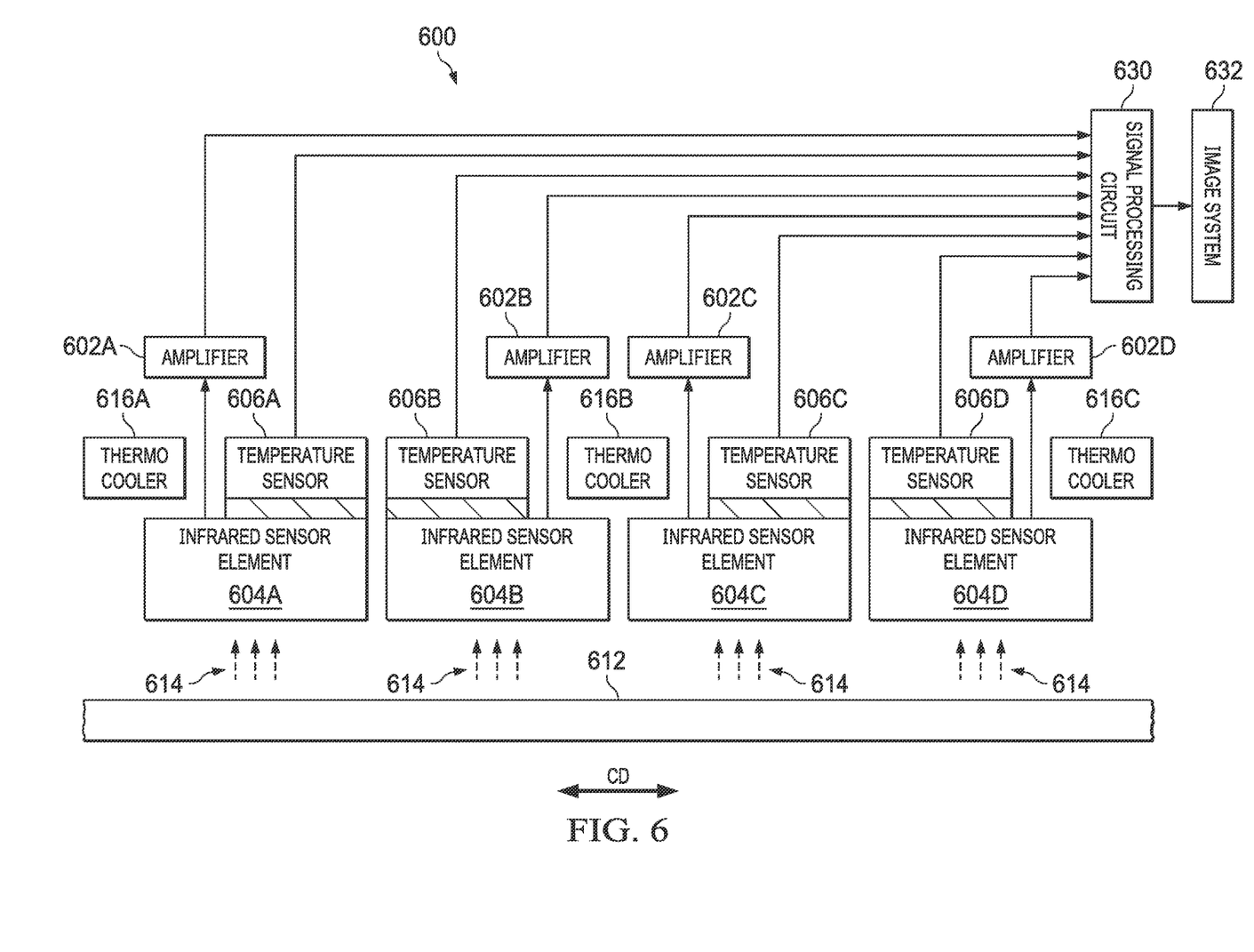
FIG. 6 schematically depicts a thermal radiation detection system having an array of infrared sensor elements.

FIG. 6 schematically depicts a thermal radiation detection system 600 having an array of infrared sensor elements 604A-D. While four infrared sensor elements 604A-D are shown for the purposes of illustration, the thermal radiation detection system 600 can include any suitable number of infrared sensor elements. The array of infrared sensor elements 604A-D can be arranged such that it generally extends in a cross direction (CD) across an article 612 to detect infrared radiation 614. In this embodiment, each infrared sensor elements 604A-D is configured to provide an output signal to a respective amplifier 602A-D. Each of the amplifiers 602A-D is configured to provide its output to a signal processing circuit 630. In this embodiment, temperature sensors 606A-606D are thermally bonded to respective infrared sensor elements 604A-D. The temperature sensors 606A-606D are configured to provide signals to the signal processing circuit 630 responsive to the sensed temperature proximate to the infrared sensor elements 604A-D. The thermal radiation detection system 600 also includes thermoelectric coolers 616A-616C. The thermoelectric coolers 616A-616C are operative to regulate the operational temperature of the infrared sensor elements 604A-D to within a range of about 5° C. to about 40° C., for example, specifically reciting all 1° C. increments within the above-recited range and all ranges formed therein or thereby. Responsive to the signals received from the amplifiers 602A-D and the temperature sensors 606A-606D, the signal processing circuit 630 can provide an output to an image system 632, or other suitable system.

Figure 7:
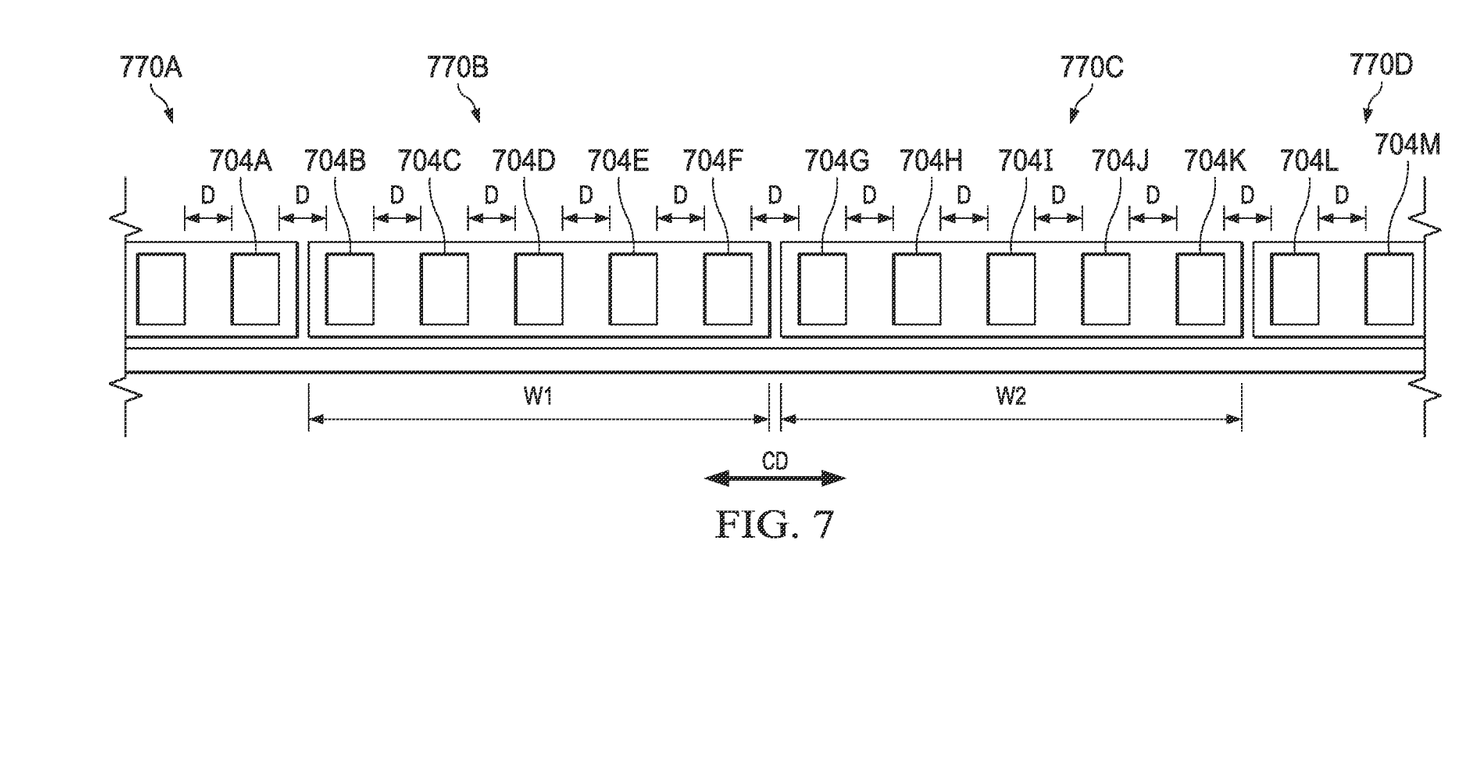
FIG. 7 schematically illustrates the placement of a plurality of arrays, each of which comprises infrared sensor elements arranged linearly.

FIG. 7 schematically illustrates the placement of a plurality of arrays 770A-770D, each of which comprise infrared sensor elements arranged linearly. As shown, the illustrated portion of the array 770A includes infrared sensor element 704A, the array 770B includes infrared sensor elements 704B-704F, the array 770C includes infrared sensor elements 704G-704K, and the array 770D includes infrared sensor elements 704L-M. The arrays 770A-770D can be modular, such that any suitable number of arrays can be placed side by side to provide the desired width. As shown, each infrared sensor element with an array is equally spaced from adjacently infrared sensor elements, as shown by distance "D". Furthermore, the distance "D" is also maintained between the outermost infrared sensor elements of adjacently positioned arrays. By way of example, the infrared sensor element 704A of the array 770A is separated by a distance of "D" from the infrared sensor element 704B of the array 770B. Thus, from a data collection perspective, the imaging in a cross direction (CD) can be generally uniform across the entire article, even if a plurality of arrays of infrared sensor elements are placed side by side. Further, while the width of the arrays can vary (shown as W1 and W2 in FIG. 7), in some embodiments the width of the array is in the range of 10 mm to 200 mm. In some embodiments, each of the arrays has a width of 100 mm.

Figure 8:
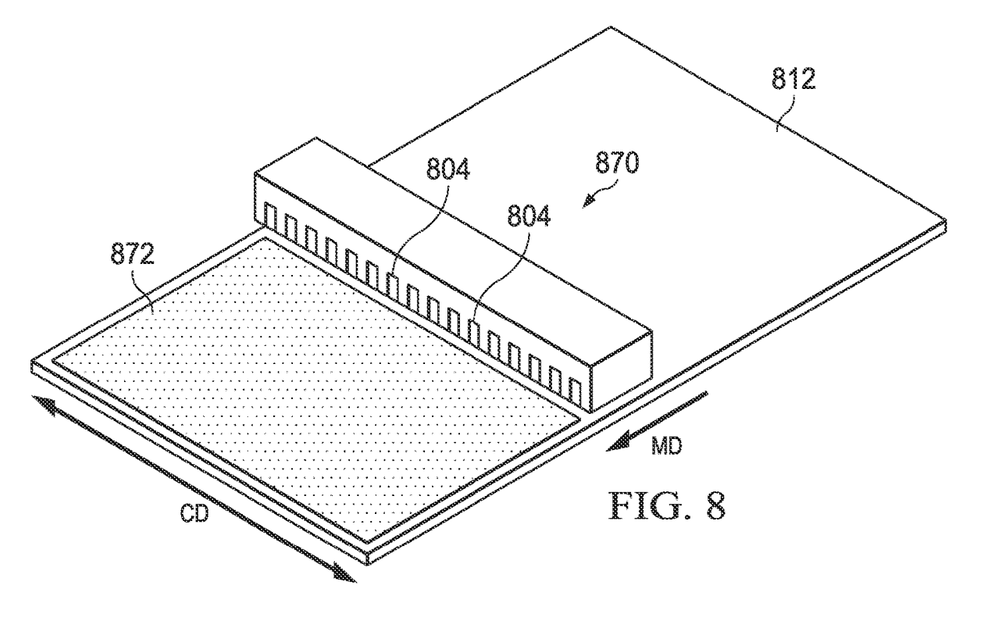
FIG. 8 is a simplified isometric view of an article moving in a machine direction (MD) relative to a linear array of infrared sensor elements.
Figure 9:
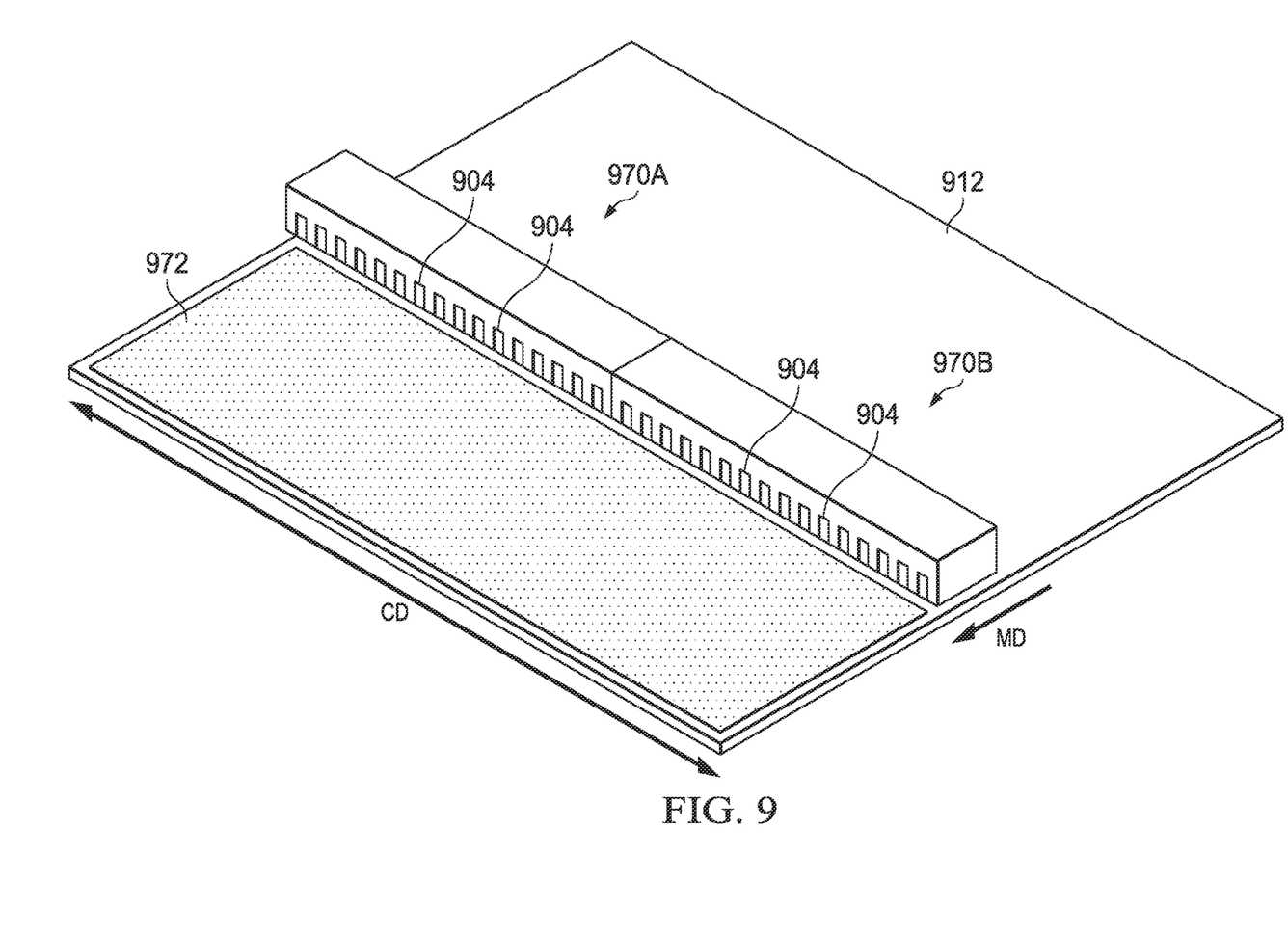
FIG. 9 is a simplified isometric view of another article moving in a machine direction (MD) relative to a plurality of linear arrays, each of which includes a plurality of infrared sensor elements.

FIG. 8 is a simplified isometric view of an article 812 moving in a machine direction (MD) relative to an array 870 of infrared sensor elements 804 and in close proximity to article 812 as is typical of a contact image sensor (CIS) or linescan application. In one embodiment, close proximity of no more than 10 cm from an article 812 ensures that the space requirements for the array 870 is minimized In another embodiment, close proximity of no more than 30 cm from an article 812 ensures that the infrared energy focuses on minimum number of sensing elements 804 at a time. Ideally the infrared energy from any point on article 812 is incident on only a single sensing element 804. In some embodiments, the infrared energy from any point on article 812 may be incident on a plurality of sensing elements 804 when the cross machine direction resolution is of less importance. As shown, the infrared sensor elements 804 are linearly positioned such that they collect infrared radiation from a scan area 872. Depending on the article 812 and the width of the array 870, the scan area 872 can generally extend across the entire article 812, or a portion of the article 812. FIG. 9 is a simplified isometric view of an article 912 moving in a machine direction (MD) relative to a plurality of arrays 970A and 970B, each of which includes a plurality of infrared sensor elements 904. By positioning the arrays 970A and 970B side by side, they can collect infrared radiation from a scan area 972 that generally extends across the entire article 912, or a portion of the article 912.

Figure 10:
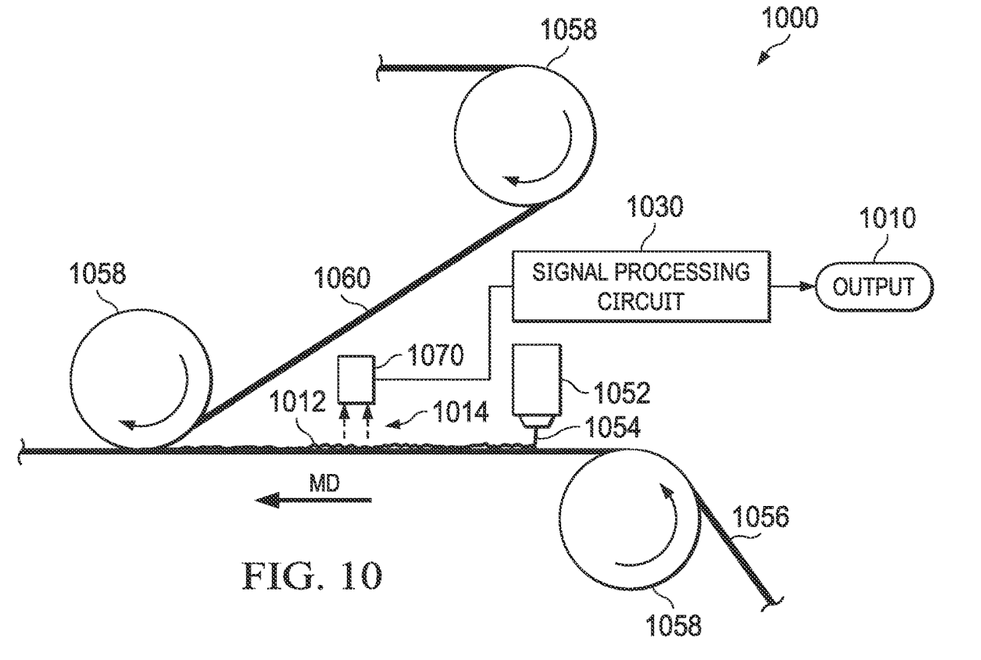
FIG. 10 schematically depicts a simplified manufacturing process incorporating an example thermal radiation detection system.

Thermal radiation detection systems in accordance with the present disclosure can beneficially be deployed at positions along a manufacturing process, including positions that are relatively confined. FIG. 10 schematically depicts a simplified manufacturing process incorporating a thermal radiation detection system 1000. While the manufacturing process depicted in FIG. 10 is a converting process for webs of materials, it is to be appreciated that the thermal radiation detection system can be used with a wide variety of different type of manufacturing processes. Thus, while webs are shown as the article of manufacture in FIG. 10, in other embodiments the web can be any of, for example, a substrate, a bottle, a package, a component of machinery, an elastic, an adhesive, an absorbent gelling material (AGM), a printing, a chemical additive, a lotion, and a volatile composition. Further, while FIG. 10 schematically depicts joining webs with an adhesive, other manufacturing process that can utilize thermal radiation detection systems in accordance with the present disclosure include processing for seaming the article, heat bonding the article, pressure welding the article, cohesive bonding the article, and so forth.

A first web of material 1056 and a second web of material 1060 are shown being joined by an adhesive 1054 dispensed from an applicator 1052. Due to the orientation of the rollers 1058, as well as other components as may be required, the available area to place an array 1070 of infrared sensor elements which is downstream of the applicator 1052 is quite confined. Nevertheless, due to the configuration of the thermal radiation detection system 1000, the array 1070 can be placed appropriately to receive infrared radiation 1014 from an article 1012. While not shown in FIG. 10, it is to be appreciated that one or more temperature sensors can also be associated with the array 1070. In some configurations, one or more thermoelectric coolers, or other types of cooling systems, can also be associated with the array 1070. A signal processing circuit 1030 can receive signaling based on the infrared radiation 1014 and the temperature of the infrared sensor elements in the array 1070. The signal processing circuit 1030 can be any of an application-specific integrated circuit, a field programmable gate array, a central processing unit, and a graphics processing unit, for example. An output 1010 of the signal processing circuit 1030 can be useable by, for example, a data acquisition system, an industrial computer control system, an imaging system, among a variety of other systems or processes.

Figure 11:
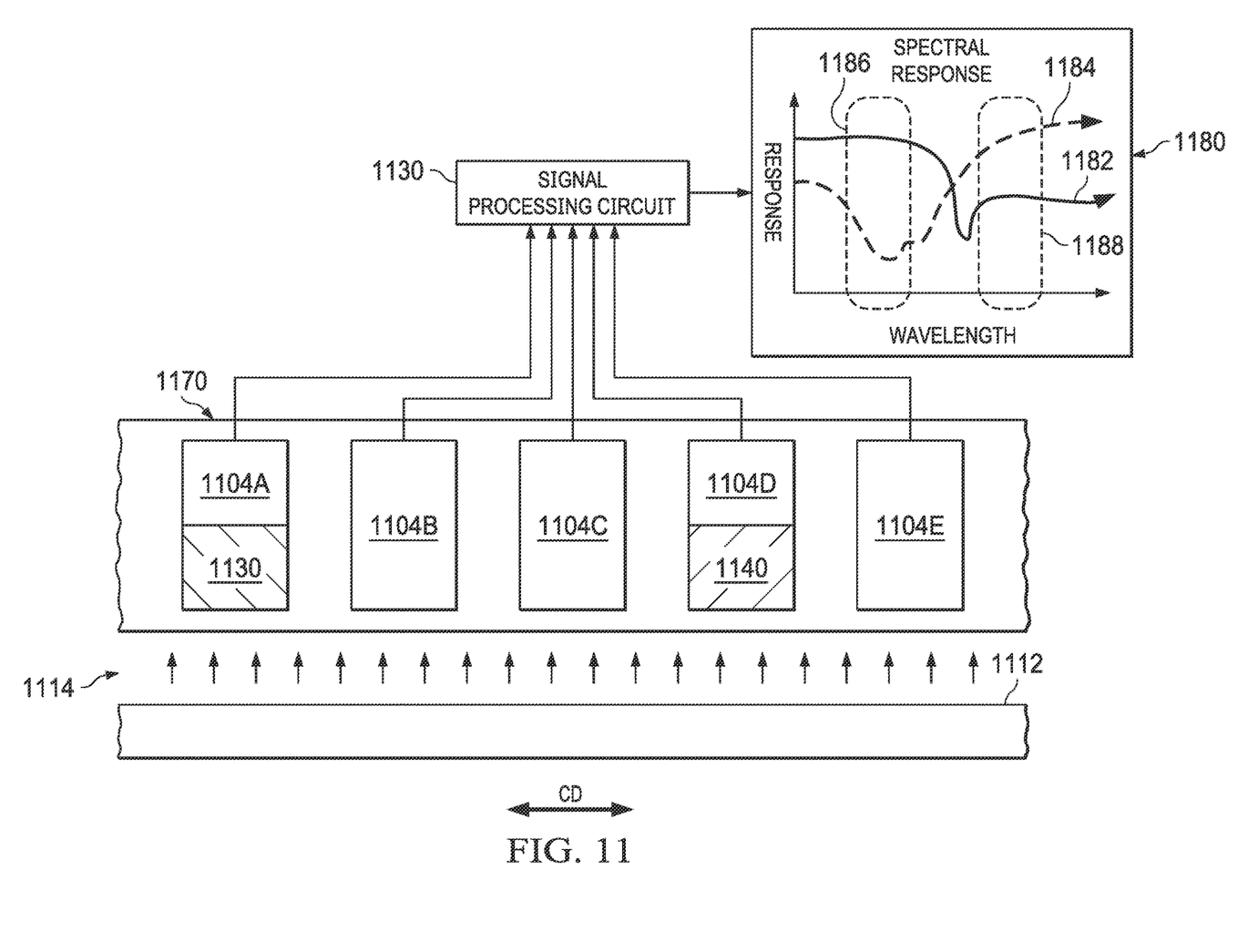
FIG. 11 is a simplified thermal radiation detection system that is configured as a spectroscopy sensor device.

Furthermore, a thermal radiation detection system in accordance with the present disclosure can be configured to function as a spectroscopy sensor. FIG. 11 is simplified thermal radiation detection system that comprises a plurality of infrared sensor elements 1104A-1104E that are positioned to receive incident radiation 1114 from an article 1112. Similar to previously described embodiments, one or more temperature sensors, amplifiers, and optionally one or more thermoelectric coolers, can be associated with the infrared sensor elements 1104A-1104E. A first notch filter 1130 can be positioned proximate to a first infrared sensor element 1104A and a second notch filter 1140 can be positioned proximate to a second infrared sensor element 1104D. As schematically shown in the spectral response chart 1180, the notch filters 1130 and 1140 allow for the analysis of the spectral response in particular bands. By way of example, a first infrared sensor element 1104A allows for the analysis of the spectral response in a first band 1186 and the second infrared sensor element 1104D allows for the analysis of the spectral response in a second band 1188. As such, the spectral response of a first material 1182 in each of the first and second bands 1186 and 1188 can be compared to the spectral response of a second material 1184 in each of the first and second bands 1186 and 1188. Using these comparisons, certain determinations regarding the first and second materials 1182 and 1184 can be made. For example, if the spectral response is high in the first band 1186 and low in the second band 1188, it could indicate the material is an absorbent gelling material (AGM). Comparatively, if the spectral response is low in the first band 1186 and high in the second band 1188, it could indicate the material is an adhesive.

Combinations

A. A thermal radiation detection system, comprising:
- a plurality of infrared sensor elements arranged as an array, wherein each of the plurality of infrared sensor elements comprises a mercury-cadmium-telluride (HgCdTe)-based photodiode infrared detector, or an Indium Arsenide (InAs)-based photodiode infrared detector, configured to generate an output responsive to detected infrared wavelengths;
- optionally, an amplifier circuit, the amplifier circuit configured to convert the current outputs from the plurality of infrared sensor elements to output voltages;
- a temperature sensing circuit, the temperature sensing circuit configured to generate signals correlated to temperatures of one or more of the plurality of infrared sensor elements; and
- a signal processing circuit, the signal processing circuit configured to generate a signal usable by an imaging system based on the signals generated by the temperature sensing circuit and the output voltages from the amplifier circuit.

B. The thermal radiation detection system according to Paragraph A, wherein the amplifier circuit comprises a transimpedance amplifier.

C. The thermal radiation detection system according to any of Paragraphs A through B, further comprising a cooling circuit, the cooling circuit configured to regulate an operational temperature of the plurality of infrared sensor elements.

D. The thermal radiation detection system according to Paragraph C, wherein the cooling circuit comprises a thermoelectric cooler.

E. The thermal radiation detection system according to Paragraph D, wherein the thermoelectric cooler is configured to regulate the operational temperature of the plurality of infrared sensor elements to a range of about 5° C. to about 40° C.

F. The thermal radiation detection system according to Paragraph E, wherein the thermoelectric cooler is configured to regulate the operational temperature of the plurality of infrared sensor elements to a range of about 15° C. to about 24° C.

G. The thermal radiation detection system according to any of Paragraphs A through F, wherein the signal processing circuit comprises any of an application-specific integrated circuit, a field programmable gate array, a central processing unit, and a graphics processing unit.

H. The thermal radiation detection system according to any of Paragraphs A through G, wherein the temperature sensing circuit comprises one or more temperature sensing device, wherein the one or more temperature sensing device is a negative temperature coefficient thermistor, a thermocouple, or a resistance temperature detector.

I. The thermal radiation detection system according to Paragraph H, wherein each of the plurality of infrared sensor elements is associated with a respective transimpedance amplifier and a respective temperature sensing device.

J. The thermal radiation detection system according to Paragraph I, wherein each of the plurality of infrared sensor elements is positioned proximate to a respective negative temperature coefficient thermistor.

K. The thermal radiation detection system according to Paragraph J, wherein each of the plurality of infrared sensor elements is bonded to the respective negative temperature coefficient thermistor.

L. The thermal radiation detection system according to any of Paragraphs A through K, comprising a plurality of thermoelectric coolers, wherein each of the plurality of thermoelectric coolers are positioned to regulate the operational temperature of a subset of the plurality of infrared sensor elements.

M. The thermal radiation detection system according to any of Paragraphs A through L, wherein a width of the array is greater than about 10 cm.

N. The thermal radiation detection system according to any of Paragraphs A through M, wherein the array comprises more than 10 infrared sensor elements.

O. The thermal radiation detection system according to any of Paragraphs A through N, wherein the plurality of infrared sensor elements arranged as the array is a first plurality of infrared sensor elements arranged as a first linear array.

P. The thermal radiation detection system according to Paragraph O, further comprising:
 a second plurality of infrared sensor elements arranged as a second linear array.

Q. The thermal radiation detection system according to Paragraph P, wherein:
 each infrared sensor element of the first plurality of infrared sensor elements is equally spaced apart from adjacent infrared sensors in the first linear array; and
 each infrared sensor element of the second plurality of infrared sensor elements is equally spaced apart from adjacent infrared sensors in the second linear array.

R. The thermal radiation detection system according to Paragraph Q, wherein the first linear array is provided as a first modular array and the second linear array is provided as a second modular array, wherein when the first modular array is positioned immediately adjacent to and in-line with the second modular array, an outermost infrared sensor element of the first linear array is adjacent to an outermost infrared sensor element of the second linear array, and wherein a distance from the outermost infrared sensor element of the first linear array to the outermost infrared sensor element of the second linear array is equal to the spacing between adjacent infrared sensor elements of both the first linear array and the second linear array.

S. The thermal radiation detection system of claim R, wherein the first modular array has a width greater than about 50 mm and the second modular array has a width greater than about 50 mm.

T. The thermal radiation detection system according to Paragraph S, wherein the first modular array has a width of about 100 mm and the second modular array has a width of about 100 mm U. The thermal radiation detection system according to any of Paragraphs A through T, wherein the detected mid-infrared wavelengths are about 4 microns to about 14 microns.

V. The thermal radiation detection system according to any of Paragraphs A through U, wherein the mercury-cadmium-telluride (HgCdTe)-based photodiode infrared detector or Indium Arsenide (InAs)-based photodiode infrared detector comprises:
 a plurality of layers comprising a semi-insulating Gallium arsenide (GaAs), Indium gallium arsenide (InGaAs), or Germanium (Ge) substrate in a plan view;
 a first electrode electrically coupled to a first of the plurality of layers and a second electrode electrically coupled to a second of the plurality of layers; and
 wherein the detected mid-infrared wavelengths are transmitted through the GaAs, Indium gallium arsenide (InGaAs), or Germanium (Ge) substrate to the first and second electrodes.

W. The thermal radiation detection system according to any of Paragraphs A through V, further comprising a first notch filter positioned proximate to a first infrared sensor element of the plurality of infrared sensor elements and a second notch filter positioned proximate to a second infrared sensor element of the plurality of infrared sensor elements.

X. The thermal radiation detection system according to Paragraph W, wherein the output generated by the first infrared sensor element is responsive to a first set of wavelengths and the output generated by the second infrared sensor element is responsive to a second set of wavelengths.

Y. The thermal radiation detection system according to Paragraph X, wherein the output generated by each of the first and second sensor elements are usable to quantify a spectral response.

Z. The thermal radiation detection system according to any of Paragraphs A through Y, further comprising the imaging system.

AA. A thermal radiation detection system, comprising:
 a first mercury-cadmium-telluride (HgCdTe)-based or Indium Arsenide (InAs)-based photodiode infrared detector configured to generate a first output responsive to detected infrared wavelengths;
 optionally, a first transimpedance amplifier to convert the current output from the first HgCdTe-based or InAs-based photodiode infrared detector to an output voltage;
 a first temperature sensing device positioned proximate to the first HgCdTe-based or InAs-based photodiode infrared detector, the first temperature sensing device to generate a signal correlated to temperature; and
 a signal processing circuit, the signal processing circuit configured to generate a signal based on the signal generated by the first temperature sensing circuit and the output voltage from the first transimpedance amplifier.

AB. The thermal radiation detection system according to Paragraph AA, wherein the signal from the signal processing circuit is usable by an image system.

AC. The thermal radiation detection system according to Paragraph AB, further comprising the image system.

AD. The thermal radiation detection system according to any of Paragraphs AA through AC, wherein the signal from the signal processing circuit is usable by a data acquisition system.

AE. The thermal radiation detection system according to Paragraph AD, further comprising the data acquisition system.

AF. The thermal radiation detection system according to any of Paragraphs AA through AE, wherein the signal from the signal processing circuit is usable by an industrial computer control system.

AG. The thermal radiation detection system according to Paragraph AF, further comprising the industrial computer control system.

AH. The thermal radiation detection system according to any of Paragraphs AA through AG, further comprising a second HgCdTe-based or InAs-based photodiode infrared detector positioned adjacent to the first HgCdTe-based or InAs-based photodiode infrared detector.

AI. The thermal radiation detection system according to Paragraph AH, further comprising:
 a second transimpedance amplifier to convert a current output from the second HgCdTe-based or InAs-based photodiode infrared detector to an output voltage;

AJ. The thermal radiation detection system according to Paragraph AI, wherein the first temperature sensing device is positioned proximate to the second HgCdTe-based or InAs-based photodiode infrared detector and wherein the signal processing circuit is to generate a signal based on the signal generated by the first temperature sensing device and the output voltage from the second transimpedance amplifier.

AK. The thermal radiation detection system according to Paragraph AI, further comprising a second temperature sensing device positioned proximate to the second HgCdTe-based or InAs-based photodiode infrared detector, the second temperature sensing device to generate a signal correlated to temperature.

AL. The thermal radiation detection system according to Paragraph AK, wherein the signal processing circuit is configured to generate a signal based on the signal generated by the second temperature sensing device and the output voltage from the second transimpedance amplifier.

AM. The thermal radiation detection system according to Paragraph AI, further comprising:
   a first thermoelectric cooler positioned proximate to the first HgCdTe-based or InAs-based photodiode infrared detector; and
   a second thermoelectric cooler positioned proximate to the second HgCdTe-based or InAs-based photodiode infrared detector.

AN. The thermal radiation detection system according to any of Paragraphs AA through AM, wherein the first temperature sensing device is a negative temperature coefficient thermistor, a thermocouple, or a resistance temperature detector.

AO. The thermal radiation detection system according to any of Paragraphs AA through AN, further comprising the imaging system.

AP. A method for inspecting an article manufacturing process, the method comprising:
   positioning the thermal radiation detection system of Paragraph A proximate to a manufacturing process;
   advancing an article past the plurality of infrared sensor elements subsequent to the manufacturing process; and
   identifying characteristics of the manufacturing process based on the signal from the signal processing circuit.

AQ. The method according to Paragraph AP, wherein the article comprises any of a web, a substrate, a bottle, a package, a component of machinery, an elastic, an adhesive, an absorbent gelling material (AGM), a printing, a chemical additive, a lotion, and a volatile composition.

AR. The method according to any of Paragraphs AO through AQ, wherein the manufacturing process comprises any of an application of an adhesive to the article, seaming the article, heat bonding the article, pressure welding the article, and cohesive bonding the article.

AS. The method according to any of Paragraphs AO through AR, wherein the thermal radiation imaging system is positioned within 10 cm of a surface of the article.

AT. The method according to any of Paragraphs AO through AS, wherein the substrate is advanced passed the plurality of infrared sensor elements in a machine direction (MD) at a speed of at least 5 m/s.

AU. The method according to any of Paragraphs AO through AT, wherein the thermal radiation imaging system comprises a plurality of modular linear arrays of infrared sensor elements, and wherein the plurality of modular linear arrays extend in a cross direction (CD) proximate to the article.

AV. The method of claim AT, wherein the plurality of modular linear arrays extend at least partially across the article.

AW. The method according to any of Paragraphs AO through AV, wherein the thermal radiation detection system is positioned downstream of an adhesive applicator.

AX. The method according to any of Paragraphs AO through AW, wherein identifying the characteristics of the manufacturing process comprises determining a quality of an adhesive application.

AY. The method according to any of Paragraphs AO through AX, wherein the thermal radiation imaging system comprises at least two linear arrays of infrared sensor elements.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A thermal radiation detection system, comprising:
   a plurality of infrared sensor elements arranged as an array, wherein each of the plurality of infrared sensor elements comprises a semiconductor selected from a mercury-cadmium-telluride (HgCdTe)-based photodiode infrared detector, or an Indium Arsenide (InAs)-based photodiode infrared detector, configured to generate an output responsive to detected infrared wavelengths;
   a temperature sensing circuit, the temperature sensing circuit configured to generate signals correlated to temperatures of one or more of the plurality of infrared sensor elements;
   wherein the temperature sensing circuit comprises one or more temperature sensing device, wherein the one or more temperature sensing device is a negative temperature coefficient thermistor, a thermocouple, an infrared sensitive photodiode, or a resistance temperature detector; and
   a signal processing circuit, the signal processing circuit configured to generate a signal usable by an imaging system based on the signals generated by the temperature sensing circuit and output based on the infrared sensor elements.

2. The thermal radiation detection system of claim 1, comprising an amplifier circuit, the amplifier circuit configured to convert the outputs from the plurality of infrared sensor elements to output voltages, wherein the amplifier circuit comprises a transimpedance amplifier.

3. The thermal radiation detection system of claim 1, comprising a cooling circuit, the cooling circuit configured to regulate an operational temperature of the plurality of infrared sensor elements.

4. The thermal radiation detection system of claim 3, wherein the cooling circuit comprises a thermoelectric cooler.

5. The thermal radiation detection system of claim 4, wherein the thermoelectric cooler is configured to regulate the operational temperature of the plurality of infrared sensor elements to a range of about 5° C. to about 40° C.

6. The thermal radiation detection system of claim 5, wherein the thermoelectric cooler is configured to regulate the operational temperature of the plurality of infrared sensor elements to a range of about 15° C. to about 24° C.

7. The thermal radiation detection system of claim 1, wherein the signal processing circuit comprises any of an application-specific integrated circuit, a field programmable gate array, a central processing unit, and a graphics processing unit.

8. The thermal radiation detection system of claim 1, wherein the plurality of infrared sensor elements are associated with a respective transimpedance amplifier and a respective temperature sensing device.

9. The thermal radiation detection system of claim 1, wherein the plurality of infrared sensor elements are positioned proximate to a respective temperature sensing element.

10. The thermal radiation detection system of claim 9, wherein the plurality of infrared sensor elements are bonded to the respective temperature sensing elements.

11. The thermal radiation detection system of claim 1, comprising a plurality of thermoelectric coolers, wherein each of the plurality of thermoelectric coolers is positioned to regulate the operational temperature of a subset of at least one of the plurality of infrared sensor elements.

12. The thermal radiation detection system of claim 1, wherein a width of the array is greater than about 10 cm.

13. The thermal radiation detection system of claim 1, wherein the array comprises more than 10 infrared sensor elements.

14. The thermal radiation detection system of claim 1, wherein the plurality of infrared sensor elements arranged as the array is a first plurality of infrared sensor elements arranged as a first linear array.

15. The thermal radiation detection system of claim 14, comprising a second plurality of infrared sensor elements arranged as a second linear array.

16. The thermal radiation detection system of claim 15, wherein:
each infrared sensor element of the first plurality of infrared sensor elements is equally spaced apart from adjacent infrared sensors in the first linear array; and
each infrared sensor element of the second plurality of infrared sensor elements is equally spaced apart from adjacent infrared sensors in the second linear array.

17. The thermal radiation detection system of claim 16, wherein the first linear array is provided as a first modular array and the second linear array is provided as a second modular array, wherein when the first modular array is positioned immediately adjacent to and in-line with the second modular array, an outermost infrared sensor element of the first linear array is adjacent to an outermost infrared sensor element of the second linear array, and wherein a distance from the outermost infrared sensor element of the first linear array to the outermost infrared sensor element of the second linear array is equal to the spacing between adjacent infrared sensor elements of both the first linear array and the second linear array.

18. The thermal radiation detection system of claim 17, wherein the first modular array has a width greater than about 50 mm and the second modular array has a width greater than about 50 mm.

19. The thermal radiation detection system of claim 18, wherein the first modular array has a width of about 100 mm and the second modular array has a width of about 100 mm.

20. The thermal radiation detection system of claim 1, wherein the detected mid-infrared wavelengths are about 4 microns to about 14 microns.

21. The thermal radiation detection system of claim 1, wherein the mercury-cadmium-telluride (HgCdTe)-based photodiode infrared detector or the InAs-based photodiode infrared detector comprises:
a plurality of layers comprising a semi-insulating Gallium arsenide (GaAs), Indium gallium arsenide (InGaAs) or Germanium (Ge) substrate in a plan view;
a first electrode electrically coupled to a first of the plurality of layers and a second electrode electrically coupled to a second of the plurality of layers; and
wherein the detected mid-infrared wavelengths are transmitted through the GaAs, InGaAs or Ge substrate to the first and second electrodes.

22. The thermal radiation detection system of claim 1, further comprising a first notch filter positioned proximate to a first infrared sensor element of one of the plurality of infrared sensor elements and a second notch filter positioned proximate to a second infrared sensor element of the plurality of infrared sensor elements, wherein the output generated by the first infrared sensor element is responsive to a first set of wavelengths and the output generated by the second infrared sensor element is responsive to a second set of wavelengths, and wherein the output generated by each of the first and second sensor elements are usable to quantify a spectral response, he thermal radiation detection system comprising an imaging system.

* * * * *